(12) United States Patent
Brillhart et al.

(10) Patent No.: US 9,845,550 B2
(45) Date of Patent: Dec. 19, 2017

(54) UPPER DOME WITH INJECTION ASSEMBLY

(71) Applicant: Applied Materials, Inc., Santa Clara, CA (US)

(72) Inventors: Paul Brillhart, Pleasanton, CA (US); Anzhong Chang, San Jose, CA (US); Edric Tong, Sunnyvale, CA (US); Kin Pong Lo, Fremont, CA (US); James Francis Mack, Woodside, CA (US); Zhiyuan Ye, San Jose, CA (US); Kartik Shah, Sunnyvale, CA (US); Errol Antonio C. Sanchez, Tracy, CA (US); David K. Carlson, San Jose, CA (US); Satheesh Kuppurao, San Jose, CA (US); Joseph M. Ranish, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 355 days.

(21) Appl. No.: 14/613,186

(22) Filed: Feb. 3, 2015

(65) Prior Publication Data

US 2015/0233016 A1 Aug. 20, 2015

Related U.S. Application Data

(60) Provisional application No. 61/992,053, filed on May 12, 2014, provisional application No. 61/943,625, (Continued)

(51) Int. Cl.
*C30B 25/14* (2006.01)
*C30B 25/08* (2006.01)
(Continued)

(52) U.S. Cl.
CPC ............. *C30B 25/14* (2013.01); *C30B 25/08* (2013.01); *C30B 25/10* (2013.01); *H01L 21/67115* (2013.01)

(58) Field of Classification Search
CPC ......... C30B 25/14; C30B 25/10; C30B 25/08; H01L 21/67115; C03C 21/002;
(Continued)

(56) References Cited

U.S. PATENT DOCUMENTS 2,707,719 A 5/1955 Leibowitz
3,717,439 A * 2/1973 Sakai .................. C23C 16/4411
118/715

(Continued)

FOREIGN PATENT DOCUMENTS

JP 2011-005458 A 1/2011

OTHER PUBLICATIONS

International Search Report and Written Opinion for International Application No. PCT/US2015/013347 dated May 29, 2015.

*Primary Examiner* — Rudy Zervigon
(74) *Attorney, Agent, or Firm* — Patterson & Sheridan LLP

(57) ABSTRACT

Embodiments provided herein generally relate to an apparatus for delivering gas to a semiconductor processing chamber. An upper quartz dome of an epitaxial semiconductor processing chamber has a plurality of holes formed therein and precursor gases are provided into a processing volume of the chamber through the holes of the upper dome. Gas delivery tubes extend from the holes in the dome to a flange plate where the tubes are coupled to gas delivery lines. The gas delivery apparatus enables gases to be delivered to the processing volume above a substrate through the quartz upper dome.

20 Claims, 14 Drawing Sheets

Related U.S. Application Data filed on Feb. 24, 2014, provisional application No. 61/940,178, filed on Feb. 14, 2014.

(51) Int. Cl.
  *C30B 25/10*   (2006.01)
  *H01L 21/67*   (2006.01)

(58) Field of Classification Search
  CPC ... C03C 23/0075; C03C 14/004; C03C 17/30; C03C 2214/20; C03C 2217/76; C03C 3/091; C03C 8/24; B01L 3/567; B01L 2300/0681; B01L 2300/0867; B01L 2400/0622; B01L 2400/0644; B01L 3/08; B01L 3/569; B01L 9/00; B01L 2400/043; B01L 3/0203; B01L 3/56; B01L 2200/12; B01L 2300/0654; B01L 2300/0663; B01L 2300/0803; B01L 2300/0822; B01L 2300/0829; B01L 2300/0851; B01L 2300/12; B01L 2300/163; B01L 2300/1805; B01L 2300/1894
  USPC ........................................ 118/715; 156/345.1
  See application file for complete search history.

(56) References Cited

U.S. PATENT DOCUMENTS

| | | | | |
|---|---|---|---|---|
| 4,115,163 A * | 9/1978 | Gorina | .................. | C23C 14/541 117/103 |
| 4,335,822 A * | 6/1982 | Buttner | .................. | B01L 3/508 215/12.1 |
| 4,347,431 A * | 8/1982 | Pearce | .................. | C30B 31/10 118/725 |
| 4,488,743 A | 12/1984 | Schulke | | |
| 5,098,662 A * | 3/1992 | Killough | ............ | B01D 11/0219 202/168 |
| 5,156,812 A * | 10/1992 | Killough | ............ | B01D 11/0219 202/168 |
| 5,529,632 A * | 6/1996 | Katayama | ......... | H01J 37/32504 118/723 E |
| 6,031,211 A * | 2/2000 | Mailho | .................. | C23C 16/46 219/121.4 |
| 6,086,679 A * | 7/2000 | Lee | .................. | B05D 1/60 118/715 |
| 6,197,373 B1 * | 3/2001 | Brown | .................. | C23C 16/455 118/715 |
| H1960 H * | 6/2001 | Conrad | .................. | G01N 35/00 73/864.82 |
| 6,360,562 B1 * | 3/2002 | Kodas | .................. | A61K 6/0276 257/E21.304 |
| 6,383,330 B1 | 5/2002 | Raaijmakers | | |
| 6,623,856 B1 * | 9/2003 | Kodas | .................. | A61K 6/0276 428/402 |
| 6,706,334 B1 * | 3/2004 | Kobayashi | ....... | H01J 37/32082 134/1.1 |
| 6,776,874 B2 * | 8/2004 | Kobayashi | ....... | H01J 37/32082 118/724 |
| 7,631,518 B2 * | 12/2009 | Kodas | .................. | A61K 6/0276 65/17.2 |
| 8,585,820 B2 * | 11/2013 | Arena | .................. | C23C 16/4412 117/108 |
| 8,610,033 B1 * | 12/2013 | Moore | .................. | H01L 21/67109 219/390 |
| 8,741,062 B2 * | 6/2014 | Lindfors | ............ | C23C 16/4485 118/715 |
| 8,960,235 B2 * | 2/2015 | Carlson | ............ | C23C 16/45565 118/715 |
| 9,038,565 B2 * | 5/2015 | Arena | .................. | C23C 16/4412 118/708 |
| 9,261,193 B2 * | 2/2016 | Yudovsky | ............ | F16J 15/025 |
| 9,499,905 B2 * | 11/2016 | Samir | ............ | C23C 16/45504 |
| 9,512,520 B2 * | 12/2016 | Sanchez | ............ | C23C 16/4412 |
| 9,570,328 B2 * | 2/2017 | Patalay | ............ | H01L 21/67115 |
| 9,587,993 B2 * | 3/2017 | Miller | .................. | C23C 16/442 |
| 2002/0179586 A1 | 12/2002 | Wengert et al. | | |
| 2005/0069640 A1 * | 3/2005 | Kodas | .................. | A61K 6/0276 427/180 |
| 2005/0082002 A1 * | 4/2005 | Sato | ......................... | B08B 7/00 156/345.29 |
| 2006/0096540 A1 * | 5/2006 | Choi | .................. | C23C 16/45574 118/724 |
| 2007/0084406 A1 * | 4/2007 | Yudovsky | ......... | C23C 16/45578 118/724 |
| 2007/0084408 A1 * | 4/2007 | Yudovsky | ......... | C23C 16/45578 118/725 |
| 2008/0124670 A1 * | 5/2008 | Jansen | ................ | C23C 16/4412 432/29 |
| 2009/0011606 A1 * | 1/2009 | Shinozaki | ............ | C23C 16/482 438/758 |
| 2009/0283029 A1 * | 11/2009 | Arena | ................ | C23C 16/4412 117/108 |
| 2010/0236288 A1 * | 9/2010 | Kodas | .................. | A61K 6/0276 65/21.1 |
| 2010/0258530 A1 * | 10/2010 | Toyoda | .................. | C23C 16/50 216/84 |
| 2011/0056626 A1 | 3/2011 | Brown et al. | | |
| 2011/0200749 A1 * | 8/2011 | Suzuki | ................ | C23C 16/4402 427/255.5 |
| 2012/0156880 A1 | 6/2012 | Panagopoulos | | |
| 2012/0266819 A1 * | 10/2012 | Sanchez | ............ | C23C 16/4412 118/719 |
| 2012/0270384 A1 * | 10/2012 | Sanchez | ............ | C23C 16/0236 438/503 |
| 2013/0019803 A1 * | 1/2013 | Samir | ............ | C23C 16/45504 118/725 |
| 2013/0109159 A1 * | 5/2013 | Carlson | ............ | C23C 16/45565 438/503 |
| 2013/0192756 A1 * | 8/2013 | Yudovsky | ............ | F16J 15/025 156/345.1 |
| 2013/0269613 A1 * | 10/2013 | Sanchez | ............ | H01L 21/02104 118/724 |
| 2014/0026816 A1 | 1/2014 | Myo et al. | | |
| 2014/0030433 A1 * | 1/2014 | Ranish | ............ | B05C 5/00 427/248.1 |
| 2014/0137801 A1 * | 5/2014 | Lau | .................. | C30B 25/14 118/728 |
| 2015/0184290 A1 * | 7/2015 | Gum | ............ | C23C 16/4404 118/728 |
| 2015/0233016 A1 * | 8/2015 | Brillhart | .................. | C30B 25/14 118/724 |
| 2015/0275359 A1 * | 10/2015 | Fukushima | ......... | C23C 16/4412 118/712 |
| 2015/0368830 A1 * | 12/2015 | Brillhart | ............ | C23C 16/4412 118/728 |
| 2015/0376789 A1 * | 12/2015 | Motoyama | ........ | C23C 16/45587 438/792 |
| 2016/0033070 A1 * | 2/2016 | Brillhart | ............ | C23C 16/4412 137/565.01 |
| 2016/0298263 A1 * | 10/2016 | Ishikawa | .................. | C30B 25/22 |
| 2017/0082537 A1 * | 3/2017 | Ido | ......................... | G01N 21/61 |

* cited by examiner

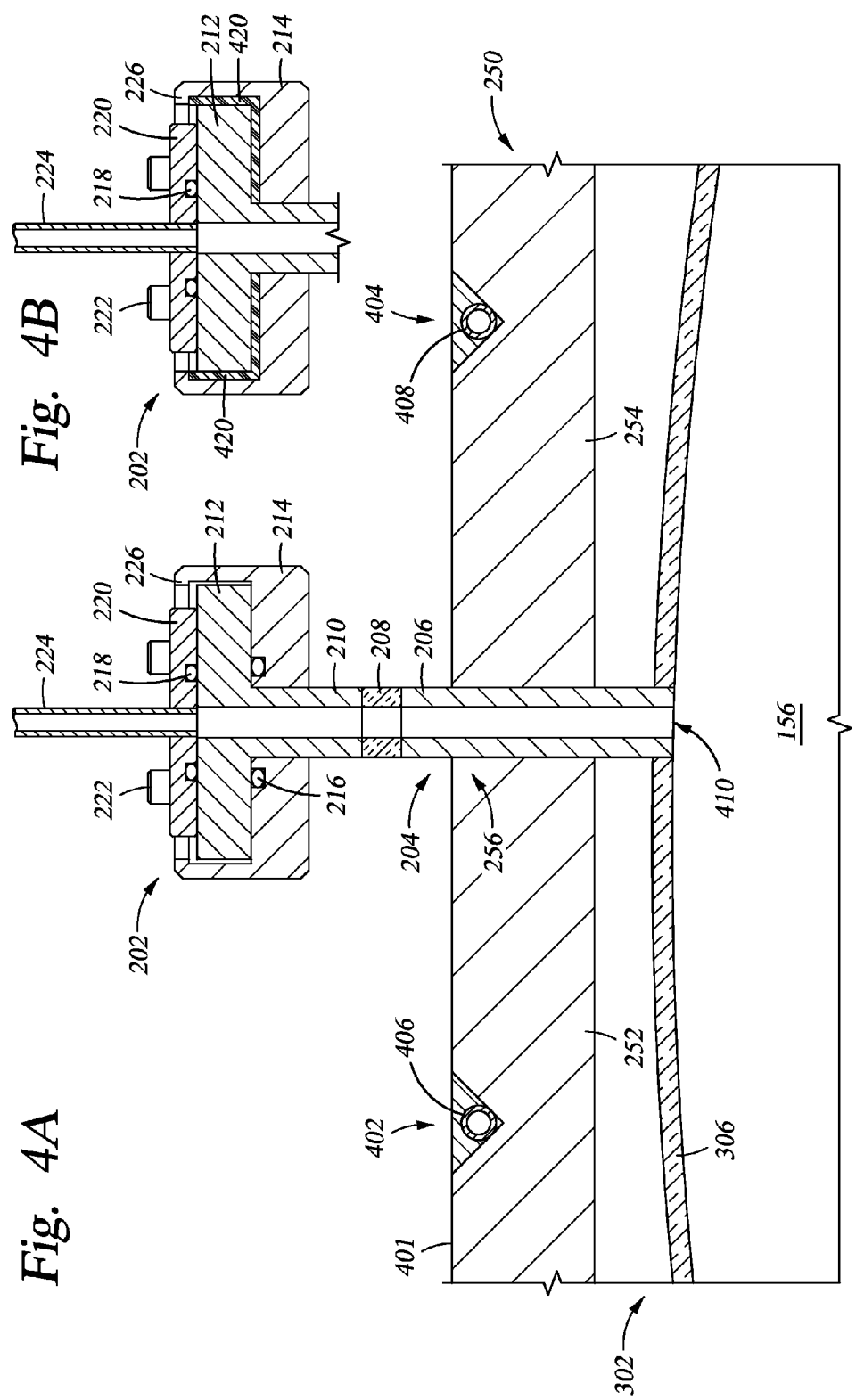

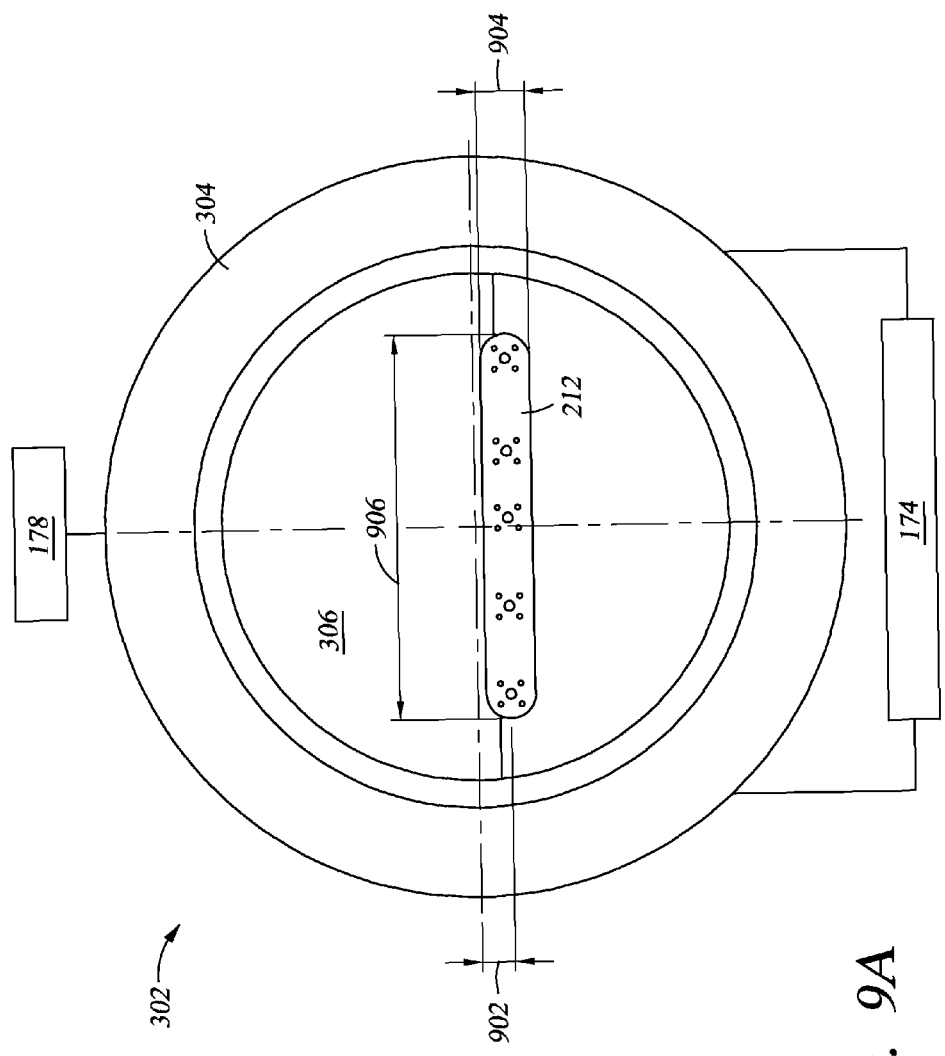

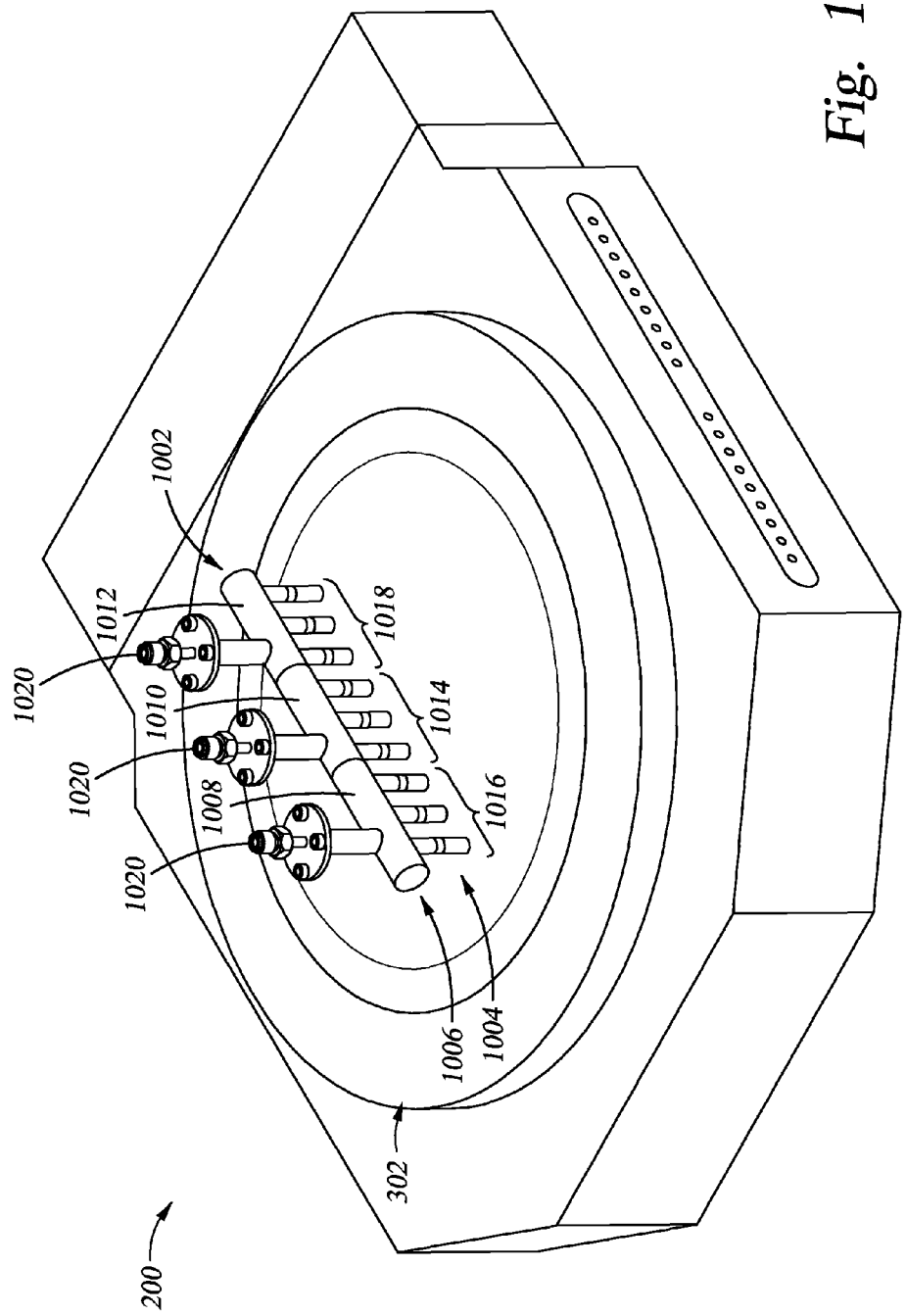

UPPER DOME WITH INJECTION ASSEMBLY

CROSS-REFERENCE TO RELATED APPLICATIONS

This application claims benefit of U.S. provisional patent application No. 61/940,178, filed Feb. 14, 2014, U.S. provisional patent application No. 61/943,625, filed Feb. 24, 2014, and U.S. provisional patent application No. 61/992,053, filed May 12, 2014, all of which are herein incorporated by reference in their entirety.

BACKGROUND

Field

Embodiments described herein generally relate to apparatus and methods for improving gas delivery to a semiconductor processing chamber. More specifically, embodiments described herein relate to an upper dome with an injection assembly.

Description of the Related Art

In semiconductor processing, various processes are commonly used to form films that have functionality in a semiconductor device. Among those processes are certain types of deposition processes referred to as epitaxy. In an epitaxy process, a gas mixture is typically introduced in a chamber containing one or more substrates on which an epitaxial layer is to be formed. Process conditions are maintained to encourage the vapor to form a high quality material layer on the substrate. Epitaxy is generally favored when high quality and uniformity of a film deposited across the surface of a substrate are desired.

In an exemplary epitaxy process, a material such as a dielectric material or semiconductor material is formed on an upper surface of a substrate. The epitaxy process grows a thin, ultra-pure material layer, such as silicon or germanium, on a surface of the substrate. The material may be deposited in a lateral flow chamber by flowing a process gas substantially parallel to the surface of a substrate positioned on a support, and by thermally decomposing the process gas to deposit a material from the gas onto the substrate surface.

Processing uniformity is generally desired in the semiconductor industry, and much research and development effort is devoted to improving processing uniformity throughout the semiconductor fabrication process. Reactor design, for example, gas flow patterns and temperature control apparatus, can affect film quality and uniformity in epitaxial growth. Since gas flow characteristics can impact the film performance on the substrate, there is a need for a gas delivery and deposition apparatus which facilitates growth of a uniform material layer on the substrate.

Cross-flow gas delivery apparatuses inject gas into the processing chamber such that the gas flows laterally across the surface of the substrate while the substrate is rotated. However, center to edge non-uniformities of the deposited film may result due to uneven gas flow characteristics. In some cases, the type and number of precursor species that may be introduced via the cross-flow gas delivery apparatus are limited.

Thus, there is a need in the art for improved gas delivery apparatus for epitaxy processes.

SUMMARY

In one embodiment, a gas delivery apparatus is provided. The gas delivery apparatus includes a light transmissive member having a plurality of holes formed therein. A plurality of tubes coupled to the light transmissive member may extend from the plurality of holes and a flange plate may be coupled at least one of the plurality of tubes.

In another embodiment, an apparatus for processing a substrate is provided. The apparatus includes a processing chamber body and a light transmissive member coupled to the chamber body. A plurality of holes may be formed through the light transmissive member and a plurality of tubes may be coupled to the light transmissive member at a first end and extend from the plurality of holes. A flange plate may be coupled to a second end of the plurality of tubes and a reflector plate may be coupled to the chamber body. The reflector plate may be disposed between the light transmissive member and the flange plate.

In yet another embodiment, an apparatus for processing a substrate is provided. The apparatus includes a processing chamber body having a first light transmissive member and a second light transmissive member coupled to the chamber body opposite the first light transmissive member. The chamber body, the first light transmissive member, and the second light transmissive member may define a processing volume. A substrate support may be disposed within the processing volume and a lamp array may be coupled to the chamber body outside the processing volume. A plurality of holes may be formed through the second light transmissive member and a tube may be coupled to each of the plurality of holes, the plurality of tubes extending from each hole away from the processing volume. A flange plate may be coupled to the tube, and a reflector plate, which may be coupled to the chamber body, may be disposed between the second light transmissive member and the flange plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4A illustrates a cross-sectional view of a gas delivery apparatus according to one embodiment described herein.

FIG. 4B illustrates a cross-sectional view of a gas delivery apparatus according to one embodiment described herein.

FIG. 9A illustrates a plan view of the dome and flange plate of FIG. 6A.

FIG. 10 illustrates a perspective view of a processing chamber with a gas delivery apparatus according to one embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments provided herein generally relate to an apparatus for delivering gas to a semiconductor processing chamber. A quartz dome of an epitaxial semiconductor processing chamber has a plurality of holes formed therein and precursor and carrier gases are provided into a processing volume of the chamber through the holes of the upper dome. Gas delivery tubes extend from the holes in the dome to a flange plate where the tubes are coupled to gas delivery lines. The gas delivery apparatus enables gases to be delivered to the processing volume above a substrate through the quartz dome.

Figure 1:
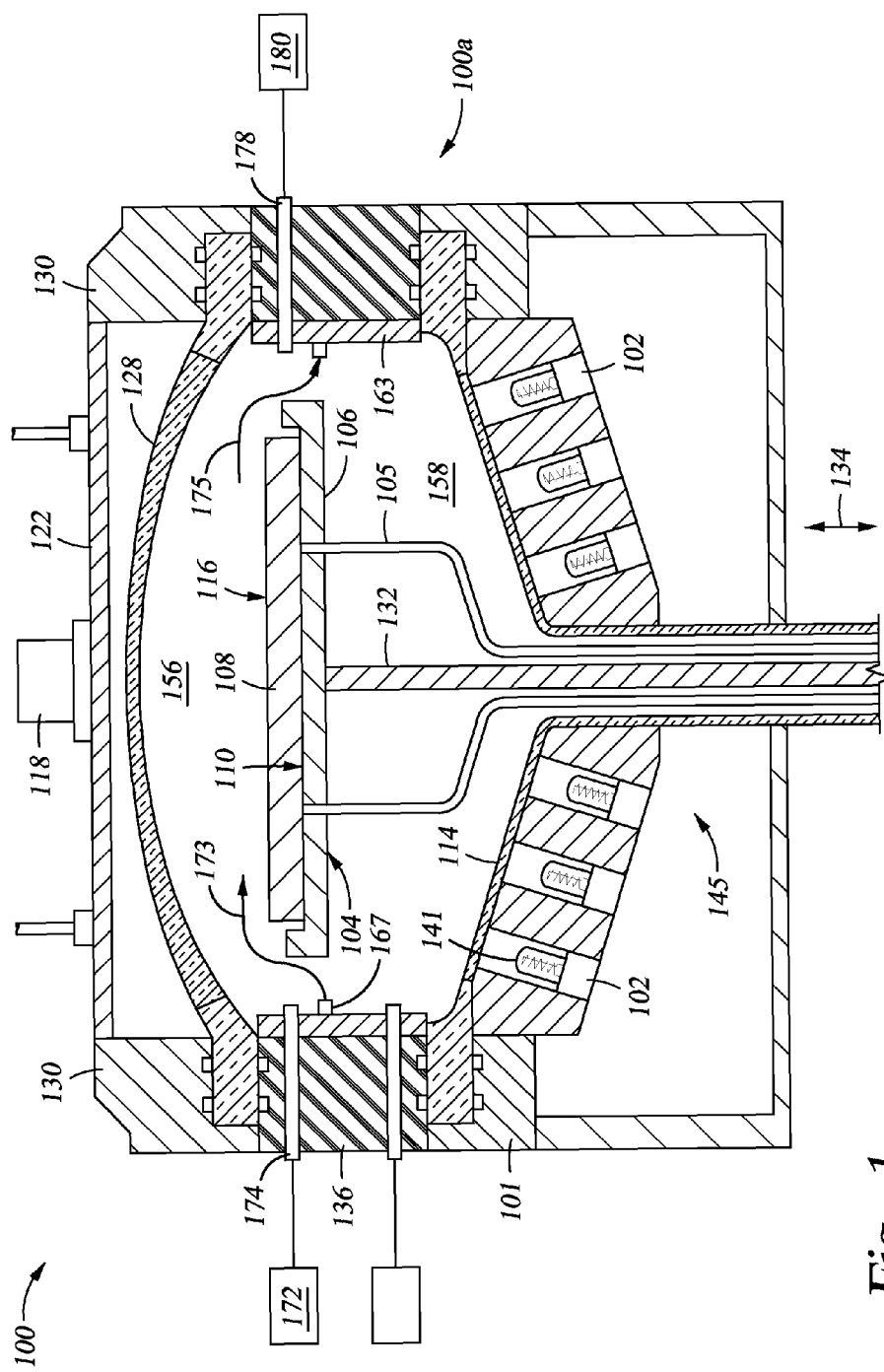
FIG. 1 illustrates a schematic, cross-sectional view of a processing chamber according to one embodiment described herein.

FIG. 1 illustrates a schematic, cross-sectional view of a process chamber 100. The process chamber 100 is used to process one or more substrates, including the deposition of a material on an upper surface 116 of a substrate 108. The process chamber 100 comprises a chamber body member 100a, a first quartz dome 114, and a second quartz dome 128 which define a processing volume 156. It is contemplated that the first quartz dome 114 and the second quartz dome 128 may generally be considered to be light transmissive members. A base ring 136, which is disposed between a first clamp ring 101 and a second clamp ring 130, separates the first quartz dome 114 and the second quartz dome 128. A liner assembly 163 is coupled to the base ring 136 and a preheat ring 167 is coupled to the liner assembly 163. The preheat ring 167 extends radially inward from the liner assembly 163 to shield excess radiation from propagating beyond the preheat ring 167 and to preheat incoming process gases before the process gases contact the upper surface 116 of the substrate 108. A reflector plate 122 is disposed adjacent to the second dome 128 outside the processing volume 156 and the reflector plate 122 is coupled to the second clamp ring 130.

A lamp array 145 is coupled to the first clamp ring 101 adjacent the first dome 114. The lamp array 145 includes one or more lamps 102, each lamp 102 having a bulb 141. The lamp array 145 is configured to heat the substrate 108 to a desired temperature over a relatively short period of time. The heating process may include repetitive heating and cooling cycles to achieve desirable material properties either deposited on or used as a bake on the upper surface 116 of the substrate 108. The lamp array 145 also provides for independent control the temperature at various regions of the substrate 108, thereby facilitating the deposition of a material onto the upper surface 116 of the substrate 108. One or more pyrometers 118 may be optionally coupled to the chamber 100 via the reflector plate 122 or coupled through the lamp array 145. The pyrometers 118 are configured to measure a temperature of the substrate 108 or a substrate support 106 by receiving radiation emitted from the substrate 108 through the second dome 128 and comparing the received radiation to a temperature-indicating standard. Alternatively, one or more pyrometers 118 may be configured to measure the first quartz dome 114 temperature and/or the second quartz dome 128 temperature.

The substrate support 106 is disposed within the processing region 156 of the process chamber 100. The substrate support 106, together with the second quartz dome 128, bounds the processing region 156 and a purge gas region 158 is opposite the substrate support 106 from the second quartz dome 128. The substrate support 106 may be rotated during processing by a central shaft 132 to minimize the effect of thermal and process gas flow spatial anomalies within the process chamber 100. The substrate support 106 is supported by the central shaft 132, which may move the substrate 108 in an axial direction 134 during loading and unloading, and in some instances, during processing of the substrate 108.

The reflector 122 is placed outside the second quartz dome 128 to reflect infrared light that is radiating off the substrate 108 during processing back onto the substrate 108. The reflector 122 can be made of a metal, such as aluminum or stainless steel. The efficiency of the reflection can be improved by coating the reflector 122 with a highly reflective coating, such as gold, or by polishing the reflector 122 to improve the reflectivity. In one embodiment, a selective coating which is tuned for specific wavelengths may be disposed on the reflector in selected regions. In this embodiment, the selective coating may enhance low temperature pyrometer accuracy and repeatability. In another embodiment, the reflector 122 may absorb light and may be coated with a light absorbing material to improve radiative cooling and thermal uniformity of the chamber 100.

The reflector 122 can have one or more channels (not shown), which may be machined, connected to a cooling source (not shown). The channels connect to a passage (not shown) formed on a side of the reflector 122. The passage is configured to carry a flow of a fluid, such as water, and may run along the side of the reflector 122 in any desired pattern covering a portion or entire side of the reflector 122 for cooling the reflector 122. In another embodiment, the reflector 122 may be coupled to a fluid source which is configured to heat the reflector 122. The fluids which may be flowed through the passage include various heating or cooling fluids, such as a deionized water and glycol mixture or an inert fluorinated liquid.

Process gas supplied from a process gas supply source 172 is introduced into the processing region 156 through a process gas inlet 174 formed in the sidewall of the base ring 136. The process gas inlet 174 is configured to direct the process gas in a generally radially inward direction and may be tuned by the use of zones to enable improved center to edge uniformity. During the film formation process, the substrate support 106 may be located in the processing position, which is adjacent to and at about the same elevation as the process gas inlet 174. In this arrangement, the process gas flows up and around along flow path 173 across the upper surface 116 of the substrate 108 in a quasi laminar flow fashion.

The process gas exits the process gas region 156 (along flow path 175) through a gas outlet 178 located on the side of the process chamber 100 opposite the process gas inlet 174. The process gas inlet 174 and the gas outlet 178, which are along the plane of the substrate 108 upper surface 116, are aligned to each other and disposed approximately at the same elevation to facilitate the laminar flow of process gas across the substrate 108. In one embodiment, the process gas inlet 174 and gas outlet 178 may be disposed at a first elevation radially inward of the liner assembly 163, however, the process gas inlet 174 and gas outlet 178 may be in a second plane, which may be lower than the first plane, raidally outward of the liner assembly 163. Removal of the process gas through the gas outlet 178 may be facilitated by a vacuum pump 180 coupled to the gas outlet 178. To further increase deposition uniformity, the substrate 108 may be rotated by the substrate support 106 during processing.

Figure 2:
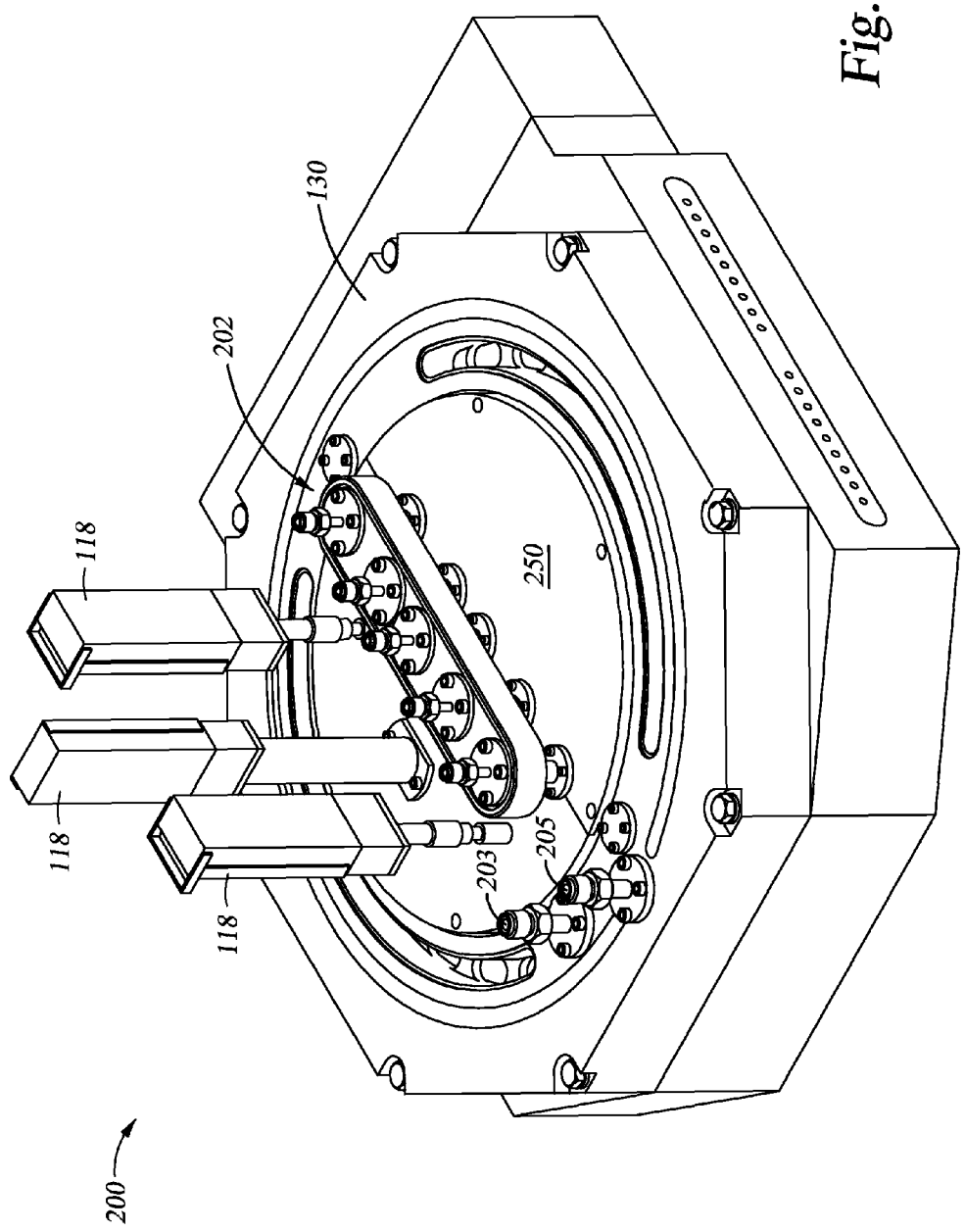
FIG. 2 illustrates a top perspective view of a processing chamber according to one embodiment described herein.

FIG. 2 illustrates a top perspective view of a processing chamber 200. Aspects of the processing chamber 200 which are similar to the chamber 100 of FIG. 1 have been discussed in greater detail above. The chamber 200 includes a gas injection assembly 202 and a reflector plate 250. The gas injection assembly 202 is configured to provide processing gas through a second dome (not shown in FIG. 2, see FIG. 6-FIG. 9) of the processing chamber 200. Gas delivery tubes (See FIG. 4 and FIG. 6-FIG. 8) extend from the second dome to the injection assembly 202 through the reflector plate 250. The reflector plate 250 is coupled to the second clamp ring 130 above the second dome. The reflector plate 250 generally shields the injection assembly 202 from radiation that passes through the second dome. The one or more pyrometers 118 are coupled through the reflector plate 250 to view the substrate through the second dome. A coolant inlet port 203 and coolant outlet port 205 are provided to supply the second clamp ring 130 with a coolant fluid.

Figure 3:
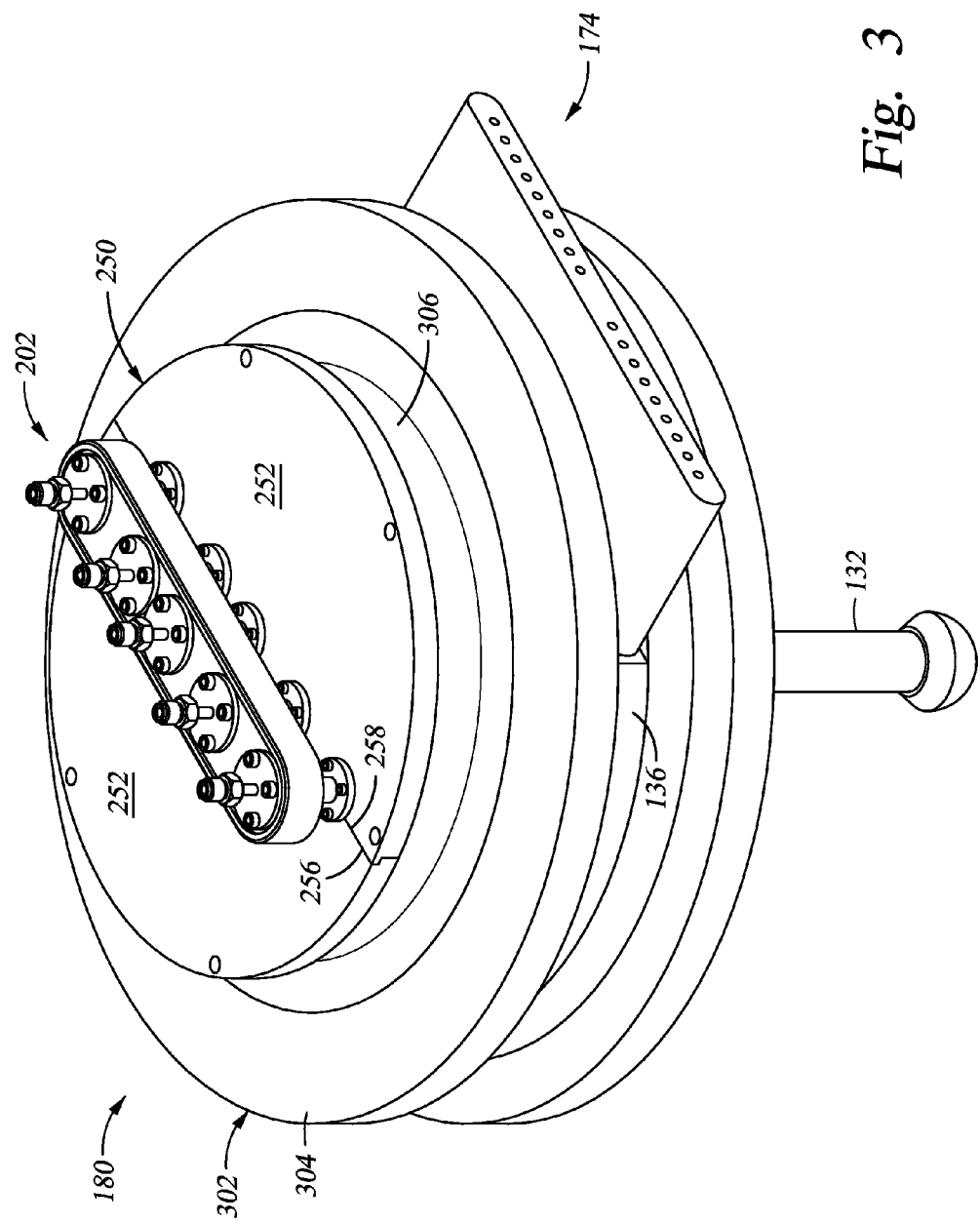
FIG. 3 illustrates a perspective view of internal chamber components with a chamber body removed according to one embodiment described herein.

FIG. 3 illustrates a perspective view of internal chamber components of the processing chamber 200. As depicted, the first clamp ring 101 and the second clamp ring 130 (FIG. 1) are removed to expose the interior of the chamber 200. The process gas inlet 174 is coupled through the base ring 136 to enable a laminar flow of process gas across the upper surface 116 of the substrate 108. The central shaft 132 is coupled to the substrate support 106 (FIG. 1). As process gas flows across the upper surface 116 of the substrate 108, the process gas exits the processing region 156 via the process gas outlet 178. The gas injection assembly 202, which delivers process gas to the processing region 156 from above the substrate 108, enables a greater degree of flexibility when processing the substrate 108. It is believed that a combination of laminar cross-flow and top-down flow of process gases may improve deposition uniformity during epitaxial processes.

In one embodiment, various precursors, such as Group III and Group V precursors, may be flowed from either the gas inlet 174 across the substrate 108, the gas injection assembly 202, or a combination thereof. For example, Group III precursors may be flowed from the gas injection assembly 202 while Group V precursors are provided from the gas inlet 174, or vise versa. Different group precursors may also be flowed together through the gas injection assembly 202 or the gas inlet 174, or both. It is believed that gas provided from the gas injection assembly 202 allows for a shorter path of travel to the substrate 108, which also increases the gas concentration at the surface 116. It is believed that the increased gas concentration may enhance nucleation at the surface 116 of the substrate 108. As a result, a more uniform crystal structure of the deposited layer may be obtained and a reduction in processing time may be realized. In addition, the shorter flow path may prevent premature gas species cracking (molecular splitting), thus, increasing overall gas utilization.

A second dome 302 is disposed above and coupled to the base ring 136. The second dome 302, or light transmissive member, is formed from a light transmissive material, such as quartz or sapphire. The second dome 302 comprises an outer region 304 and an inner region 306. The outer region 304 is the portion of the second dome 302 that is coupled to the base ring 136 while the inner region 306 has a mostly curved profile that at least partially defines the processing volume 156. In one example, the inner region 306 of the second dome 302 is light transmissive and the outer region 304 is primarily non-light transmissive. The inner region 306 has one or more holes formed therein which enable gas delivery to the processing volume 156 through the second dome 302.

The reflector plate 250 is disposed above the inner region 306 of the second dome 302 between the injection assembly 202 and the second dome 302. As such, the reflector plate 250 may be circular in shape and may be sized similarly to the inner region 306 of the second dome 302. The reflector plate 250 is formed from a thermally stable metallic material, such as aluminum or stainless steel. The reflector plate 250 may be plated (i.e. gold or silver plated) or highly polished to improve the reflectivity of the reflector plate 250 which faces the second dome 302. Alternatively, a surface of the second dome 302, such as the surface facing the reflector plate 250 or the surface facing the processing region 156, may be coated with a reflective or absorptive material. Suitable reflective materials include gold or silver and suitable absorptive materials include a black colored material, such as a dielectric material selected to absorb desired wavelengths of electromagnetic energy. A thickness of the reflector plate may be between about ¼ inch and about ¾ inch, such as between about ⅜ inch and about ½ inch.

The reflector plate 250 comprises a first member 252 and a second member 254 which are coupled together at a mating region 256. At the mating region 256, a portion of the first member 252 and a portion of the second member 254 may interleave in an overlapping manner. The mating region 256 may be defined along a chord of the circular reflector plate 250. In one example, the mating region 256 extending across the reflector plate 250 is aligned normal to the laminar cross-flow direction of the processing gas provided from the process gas inlet 174.

The first member 252 and the second member 254 are each configured to accommodate the gas tubes extending through the reflector plate 250 at the mating region 256. For example, the second member 254 has semi-circular or parabolic shaped cut-outs 258 to allow for the passage of the gas tubes. In this example, the first member 252 also has cut-outs (not shown) which align with the cut-outs 258 of the second member 254 to form holes through the reflector plate 250. To reduce the incidence of light propagation through the cut-outs 258, any space between the tubes 204 and the cut-outs 258 may be filled with a thermally stable, radiation blocking material, such as Teflon or the like. The cut-outs 258 may be any shape that accommodates passage of the tubes 204 through the reflector plate 250 while facilitating light isolation in the processing region 156. Square shaped or rectangular shaped cut-outs, curved square cut-outs or curved rectangular cut-outs, and other similar shapes are contemplated. Light isolation for such shapes may be achieved using the fillers described above.

FIG. 4A illustrates a cross-sectional view of the gas injection assembly 202. The injection assembly 202 comprises the tube 204 which extends from a hole 410 of the second dome 302 to a flange plate 212. The tube 204 defines a channel or void such that the processing region 156 is in fluid communication with the flange plate 212. The flange plate 212 is surrounded by a clamping member 214. A gas delivery line 224, which aligns with the tube 204, is coupled to the flange plate 212 via a washer 220. The washer 220 is secured to the clamping member 214 by one or more fasteners 222, such as bolts or screws, through the flange plate 212. The flange plate 212 is separated from the clamping member 214 by a first plurality of spacers 216 and the flange plate 212 is separated from the washer 220 by a second plurality of spacers 218. The spacers 216, 218, which may be o-rings or the like, may comprise a polymer material, such as a compliant material or an elastomeric material, and may operate to prevent physical contact between the flange plate 212 and the clamping member 214 and washer 220.

In one embodiment, the flange plate 212 is formed from a quartz material and the clamping member 214, washer 220, and fasteners 222 are formed from a metallic material, such as stainless steel, aluminum, or alloys thereof. A lip 226 of the clamping member 214 may extend above a top surface of the flange plate 212. As such, a cross-sectional profile of the clamping member 214 may be U-shaped. The delivery line 224 extends from the flange plate 212 to a gas source (not shown). The gas source may deliver various processing gases and other gases to the processing region 156 via the injection assembly 202. For example, Group III, Group IV, and Group V precursors and combinations thereof may be provided by the gas source.

The tube 204 is coupled between the upper dome 302 and the flange plate 212. The tube comprises a first member 206, a second member 210, and a thermal break 208 between the first member 206 and the second member 210. The first member 206 is aligned with the hole 410 such that the first member 206 extends away from the hole 410. In one embodiment, the first member 206 may extend from the hole 410 in a vertical direction or, alternatively, at an angle. The first member 206 is coupled to the second dome 302 by a quartz weld or similar bonding method, such as diffusion bonding. The hole 410 may be circular in shape and may be normal to a plane occupied by the tube 204 where the hole 410 extends through the second dome 302. However, the hole 410 may be other shapes other than circular, such as oval shaped or square shaped. Moreover, it is contemplated that the hole 410 may be angled through the second dome 302 in an orientation other than normal to the plane occupied by the tube 204. In one embodiment, the tube 204 may extend beyond the second dome 302 into the processing volume 156 towards the substrate 108.

The first member 206 and the second member 210 each comprise a quartz material which is light transmissive, however, it is contemplated that the first member 206 and second member 210 may also be formed from a radiation blocking material, such as black quartz or bubble quartz. The thermal break 208 is coupled between the first member 206 and the second member 210 by a quartz weld or similar bonding method. The thermal break 208 comprises an at least partially opaque quartz material, such as bubble quartz. The thermal break 208, which has a greater degree of opacity than the light transmissive quartz of the first member 206 and the second member 210, reduces or prevents the propagation of light energy through the tube 204. As such, light that enters the first member 206 is prevented from propagating beyond the thermal break 208 to the second member 210 and the flange plate 212. The thermal break 208 is disposed between the first member 206 and the second member 210 above the reflector plate 250. In one embodiment, the tube 204 does not utilize the thermal break 208, rather, only the clear quartz of the first member 206 and the second member 210 form the tube 204.

A first channel 402 is formed in the first member 252 and a second channel 404 is formed in the second member 254. The first channel 402 and the second channel 404 are V-shaped or U-shaped recesses formed in a surface 401 of the reflector plate 250 facing away from the processing region 156. A first cooling conduit 406 is disposed within the first channel 402 and a second cooling conduit 408 is disposed within the second channel 404. The cooling conduits 406, 408 are tubular in shape and mimic the path (See FIG. 5) of the first and second channels 402, 404, respectively. In one embodiment, a depth of the channels 402, 404 is greater than a diameter of the conduits 406, 408. As such, the conduits 406, 408, when disposed within the channels 402, 404, are located below the surface 401 of the reflector plate 250. The cooling of the reflector plate 250 is described in greater detail with regard to FIG. 5.

FIG. 4B illustrates a cross-sectional view of the gas injection assembly 202 according to one embodiment. In this embodiment, a compliant member 420 is disposed between the flange plate 212 and the clamping member 214. The compliant member 420 is formed from an elastomeric material or a vulcanized rubber, and functions to prevent physical contact between the flange plate 212 and the clamping member 214. The compliant member 420 may be a single sheet of material or may be sprayed onto either the flange plate 212 or the clamping member 214. Portions of the compliant member 420 may be counter-sunk where the fasteners 222 or tubes 204 extend through the compliant member 410 to ensure continuous contact between the compliant member 420 and the flange plate 212 or the clamping member 214.

Figure 4C:
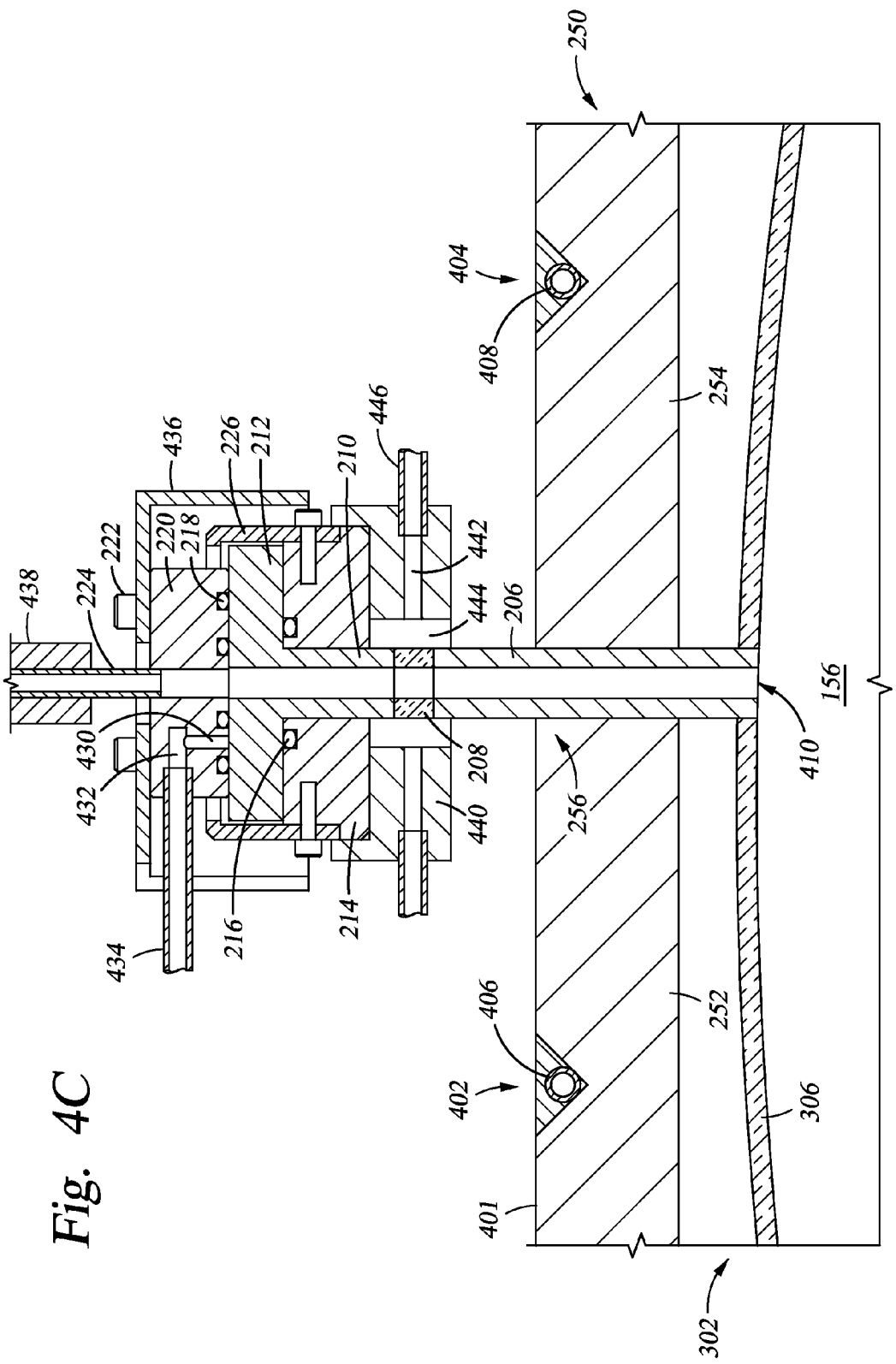
FIG. 4C illustrates a cross-sectional view of a gas delivery apparatus according to one embodiment described herein.

FIG. 4C illustrates a cross-sectional view of the gas injection assembly 202 according to one embodiment. Apparatus and features described with regard to the embodiments of FIGS. 4A and 4B may be included in the embodiments described with regard to FIG. 4C. It is contemplated that apparatus and features described with regard to FIG. 4C may also be included in the embodiments of FIGS. 4A and 4B, if desired. The gas injection assembly 202 may include a base member 440 having a channel 442 formed therein which is coupled to a fluid conduit 446. The base member 440 may also define a volume 444 adjacent the thermal break 208 and portions of the first member 206 and the second member 210. The base member 440 may be manufactured from a metallic material, such as aluminum, stainless steel, or the like, and the base member 440 may be coupled to or disposed adjacent to the clamping member 214.

The volume 444 may be fluidly coupled to the channel 442 and the fluid conduit 446. The fluid conduit 446 may be coupled to a thermal control fluid source (not shown) which provides a thermal control fluid to the volume 444 via and fluid conduit 446 and the channel 442. The thermal control fluid, such as a gas or liquid, may be provided to cool the base member 440 and portions of the tubes 204, such as the thermal break 208 and portions of the first member 206 and the second member 210. It is contemplated that the thermal control fluid may control thermal expansion of the tubes 204 to prevent breakage of the tubes 204.

In the illustrated embodiment, two second spacers 218 are disposed between the flange plate 212 and the washer 220. A first gas evacuation channel 430 may be formed in the washer 220 between the two second spacers 218. The first gas evacuation channel 430 may extend from a surface of the washer 220 disposed adjacent the flange plate 212 to a second gas evacuation channel 432 formed in the washer 220. The second gas evacuation channel 432 may be coupled to a pumping conduit 434 such that the first gas evacuation channel 430, the second gas evacuation channel 432, and the pumping conduit 434 are in fluid communication with one another. The pumping conduit 434 may be coupled to a pump (not shown) to evacuate any gas which may leak between the washer 220 and the flange plate 212. Sensors may be provided to detect any gas leakage and stop the flow of gas from the gas delivery line 224 and/or initiate pumping of leaked gas via the first gas evacuation channel 430, the second gas evacuation channel 432, and the pumping conduit 434.

A shroud 436 may be disposed about the gas injection assembly 202 to protect the gas injection assembly 202 from torquing the tubes 204 and to provide additional mechanical support to the gas injection assembly 202. The shroud 436 may be coupled to the washer 220 with the fasteners 222 and extend over the flange plate 212 and at least a portion of the clamping member 214, such as the lip 226. Also, a heat jacket 438 may be disposed about the gas delivery line 224. The heat jacket 438 may be coupled to the gas delivery line 224 and may include one or more resistive heating members configured to heat the gas delivery line 224. The resistive heating members may be coupled to a power source. It is contemplated that the heat jacket 438 may heat gas provided to the gas injection assembly 202 via the gas delivery line 224 prior to entry of the gas into the tubes 204 and the processing region 156.

Figure 5:
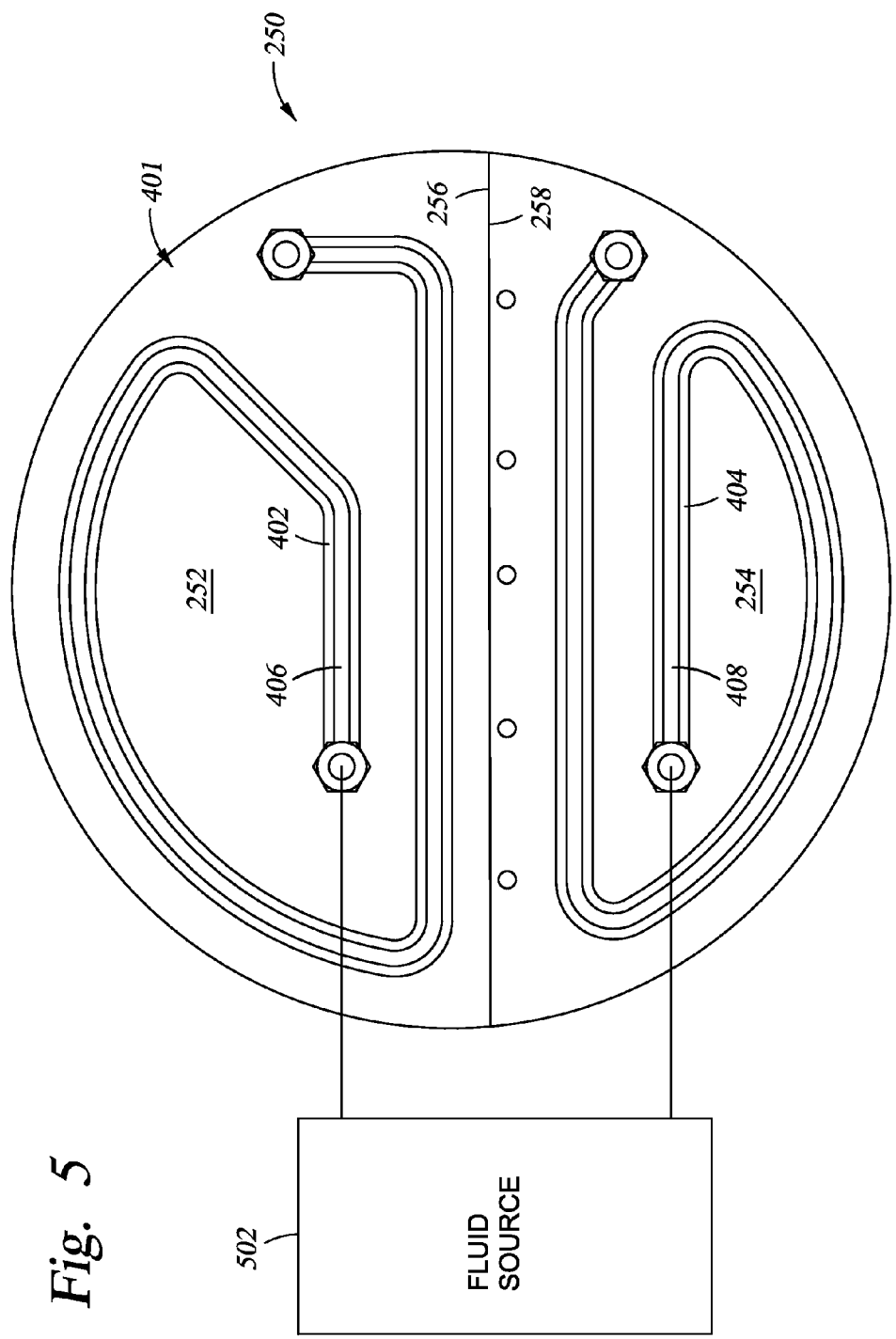
FIG. 5 illustrates a plan view of a reflector plate according to one embodiment described herein.

FIG. 5 illustrates a plan view of the reflector plate 250. The first channel 402 may traverse along a straight or tortuous path over the first member 252. Similarly, the second channel 404 may traverse along a straight, serpentine, or tortuous path over the second member 254. A bonding agent, such as an epoxy material or high temperature thermoplastic or thermoset resin, is disposed within the first channel 402 and the second channel 404. The cooling conduits 406, 408 are press fit into the bonding agent to secure the position of the conduits 406, 408 within the channels 402, 404, respectively. Alternatively the cooling conduits 406, 408 may be press fit into the channels 402, 404 and subsequently braised to seat the conduits 406, 408 to the reflector plate 250. The bonding agent may be thermally conductive to facilitate thermal control of the reflector plate.

A fluid source 502, which provides a coolant such as water or the like, is coupled to the cooling conduits 406, 408. In one embodiment, the fluid source 502 is coupled to the first conduit 406 and the first conduit 406 is fluidly coupled with the second conduit 408 such that the first conduit 406 and second conduit 408 are in series with one another. The second conduit 408 may be coupled to a coolant outlet where the coolant fluid is removed from the cooling system. In another embodiment, both the first conduit 406 and the second conduit 408 are fluidly coupled to the fluid source 502 such that the cooling conduits 406, 408 operate in parallel to one another. The conduits 406, 408 are configured to maintain a stable temperature, for example, a variation of less than about 2° C.-5° C., across the reflector plate 250.

Figure 6A:
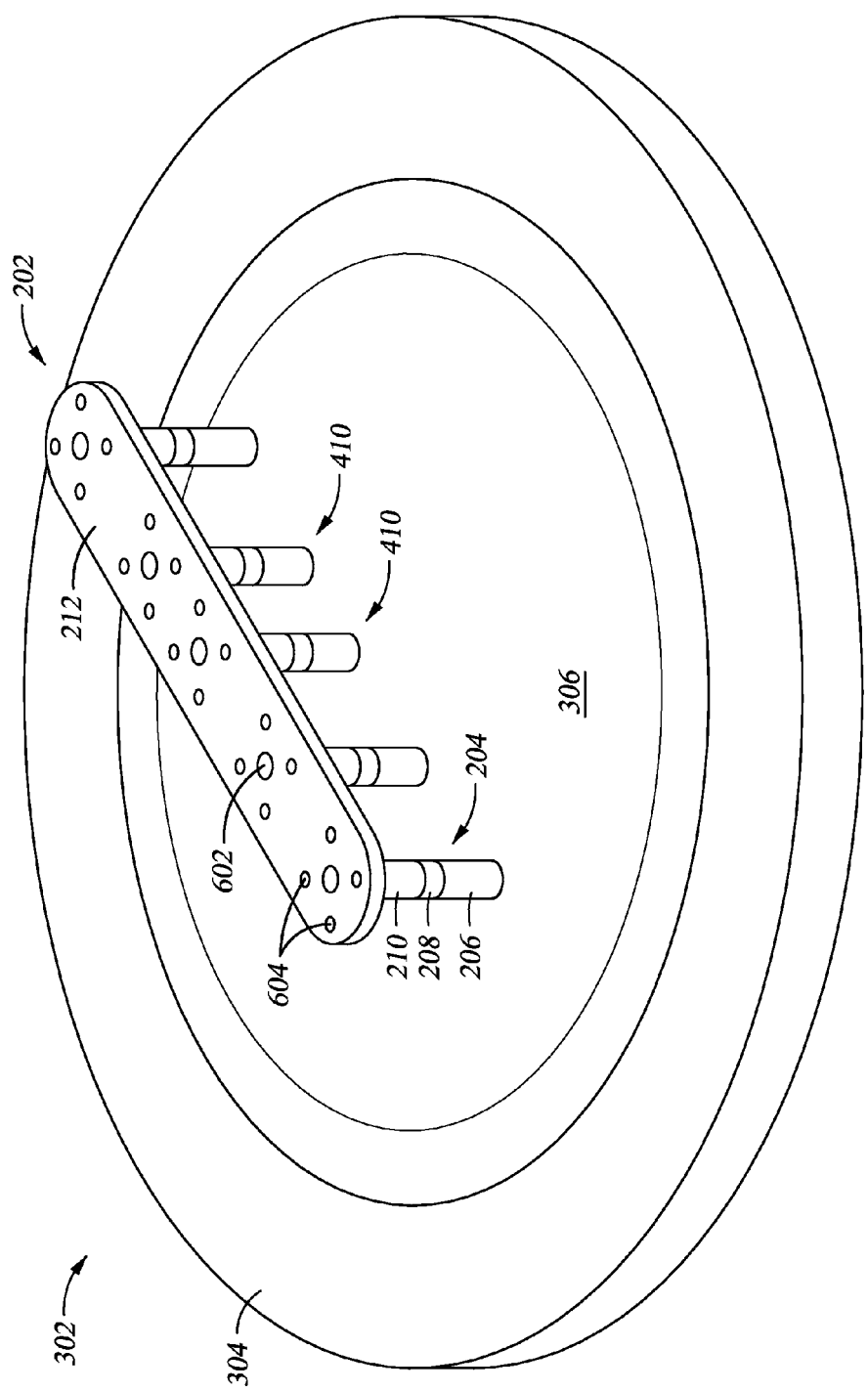
FIG. 6A illustrates a perspective view of a dome, tubes, and a flange plate according to one embodiment described herein.

FIG. 6A illustrates a perspective view of the second dome 302, tubes 204, and the flange plate 212. As illustrated, the tubes 204 are coupled between the inner region 306 of the second dome 302 and the flange plate 212. In one embodiment, five tubes 204 are disposed along the inner region 306. In one embodiment, the tubes 204 are aligned in a linear fashion, however, it is contemplated that the tubes 204 may be aligned in different orientations; for example, alternating tubes 204 may be on either side of a datum plane through the flange plate 212 in a longitudinal direction.

In the embodiment described above, five holes 410 are formed through the inner region 306 where the tubes 204 are coupled to the second dome 302. It is contemplated that a greater number or lesser number of holes 410 and tubes 204 may be utilized to more finely tune the delivery of process gases through the second dome 302. In one embodiment, the first member 206, the thermal break 208, and the second member 210 have similar inner diameters and outer diameters. For example, the inner diameter is between about 5 mm and about 15 mm, such as about 10 mm. The outer diameter is between about 10 mm and about 20 mm, such as about 16 mm. As such, a thickness of the tube 204 walls is between about 1 mm and about 3 mm, such as about 2 mm.

A plurality of holes may be formed in the flange plate 212. A first plurality of holes 602 correspond to a region where the tubes 204 are coupled to the flange plate 212. The first plurality of holes 602 delivers gas from the delivery line 224 (not shown) to the tubes 204 and the first plurality of holes 602 may have a diameter similar to the inner diameter of the tubes 204. The second plurality of holes 604 is disposed around the first plurality of holes 602. The second plurality of holes 604 are sized to accommodate the fastener 222 (not shown) such that the fastener 222 does not contact the flange plate 212. In this manner, the fastener 222 passes through the flange plate 212 without contacting the flange plate 212.

Figure 6B:
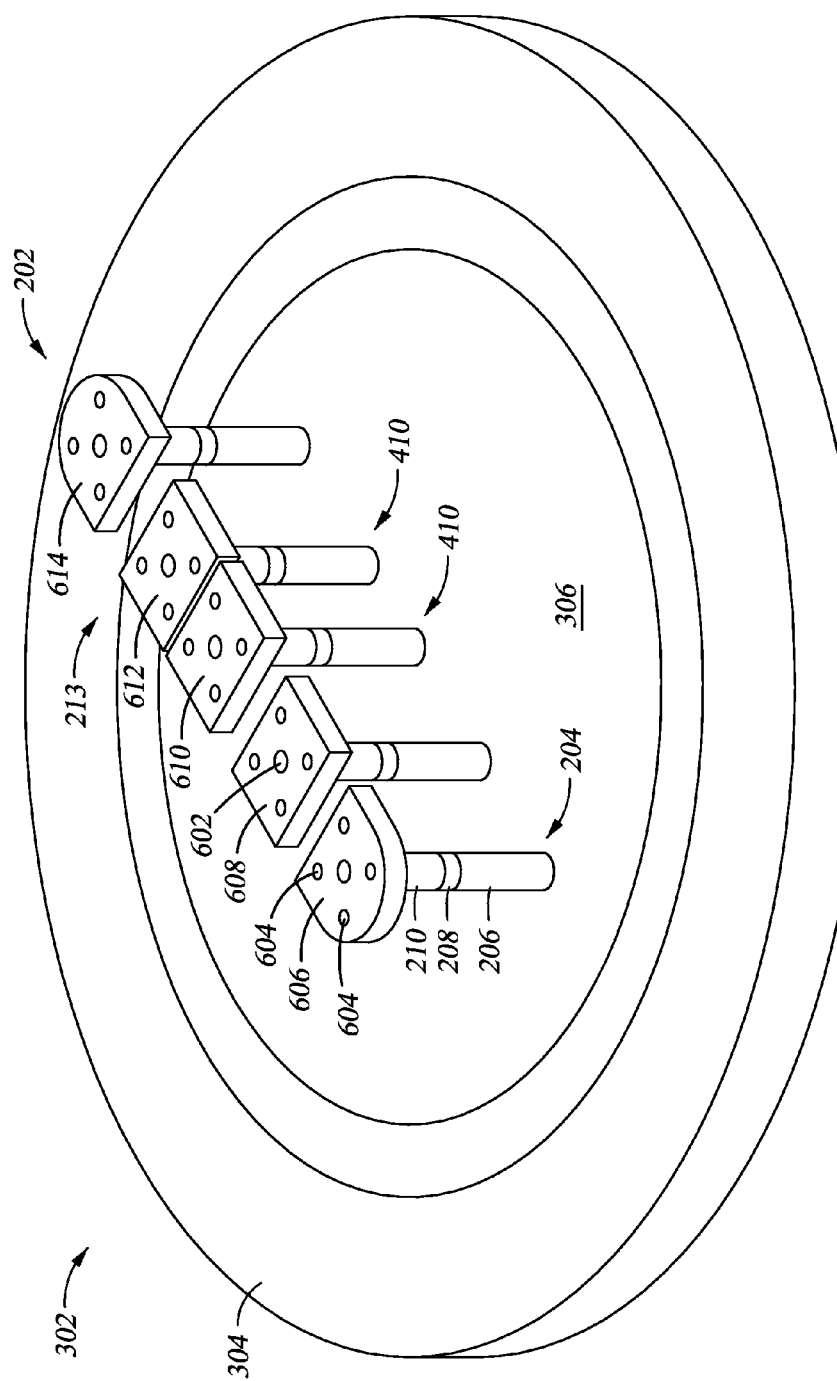
FIG. 6B illustrates a perspective view of a dime, tubes, and a flange plate according to one embodiment described herein.

FIG. 6B illustrates a perspective view of the second dome 302, tubes 204, and a sectioned flange plate 213. The flange plate 213 is similar to the flange plate 212, however, the flange plate 213 has been sectioned such that discrete portions 606, 608, 610, 612, 614 of the flange plate 213 are independent from one another. For example, each of the portions 606, 608, 610, 612, 614 may be spaced from adjacent portions. In one embodiment, each of the portions 606, 608, 610, 612, 614 correspond to a different one of the tubes 204. As such, each of the tubes 204 may be coupled to one of the portions 606, 608, 610, 612, 614. Although five portions 606, 608, 610, 612, 614 and five tubes 204 are depicted, it is contemplated that any number of tubes may be utilized and the number of portions may be matched to the number of tubes.

As depicted, each of the portions 606, 608, 610, 612, 614 may include one of the first plurality of holes 602 and four of the second plurality of holes 604, although other hole arrangements are possible. In one embodiment, central portions 608, 610, 612 may have a quadrilateral shape, for example, square-like or rectangular. Outer portions 606, 614 may have a linear edge which is adjacent to the central portions 608, 612, respectively, and a curvilinear edge similar to the flange plate 212. In one embodiment, the overall dimensions, described in greater detail with regard to FIG. 9B, of the flange plate 213 may remain similar to the flange plate 212 to enable coupling with the clamping member 214 (See FIG. 4A and FIG. 4B).

As described above, each of the portions 606, 608, 610, 612, 614 remain spaced apart from adjacent portions. Thus, thermal influences on each of the portions 606, 608, 610, 612, 614 affect only an individual portion and the influence on adjacent portions is reduced or eliminated. For example, electromagnetic energy transmitted to the flange plate 213 via the tubes 204 may heat portion 606 differently than the remaining portions 608, 610, 612, 614. The variation in thermal gradient between the portions 606, 608, 610, 612, 614 could cause undesirable torsional stress on the tubes 204, however, because the portions 606, 608, 610, 612, 614 are spatially isolated from one another, the potentially undesirable thermal effects may be eliminated, reduced, or localized to a single portion. As a result, the sectioned flange plate 213 may more adequately mitigate the negative thermal influences, such as expansion and contraction, that affect the flange plate 213 and tubes 204 coupled to the flange plate 213.

Figure 7:
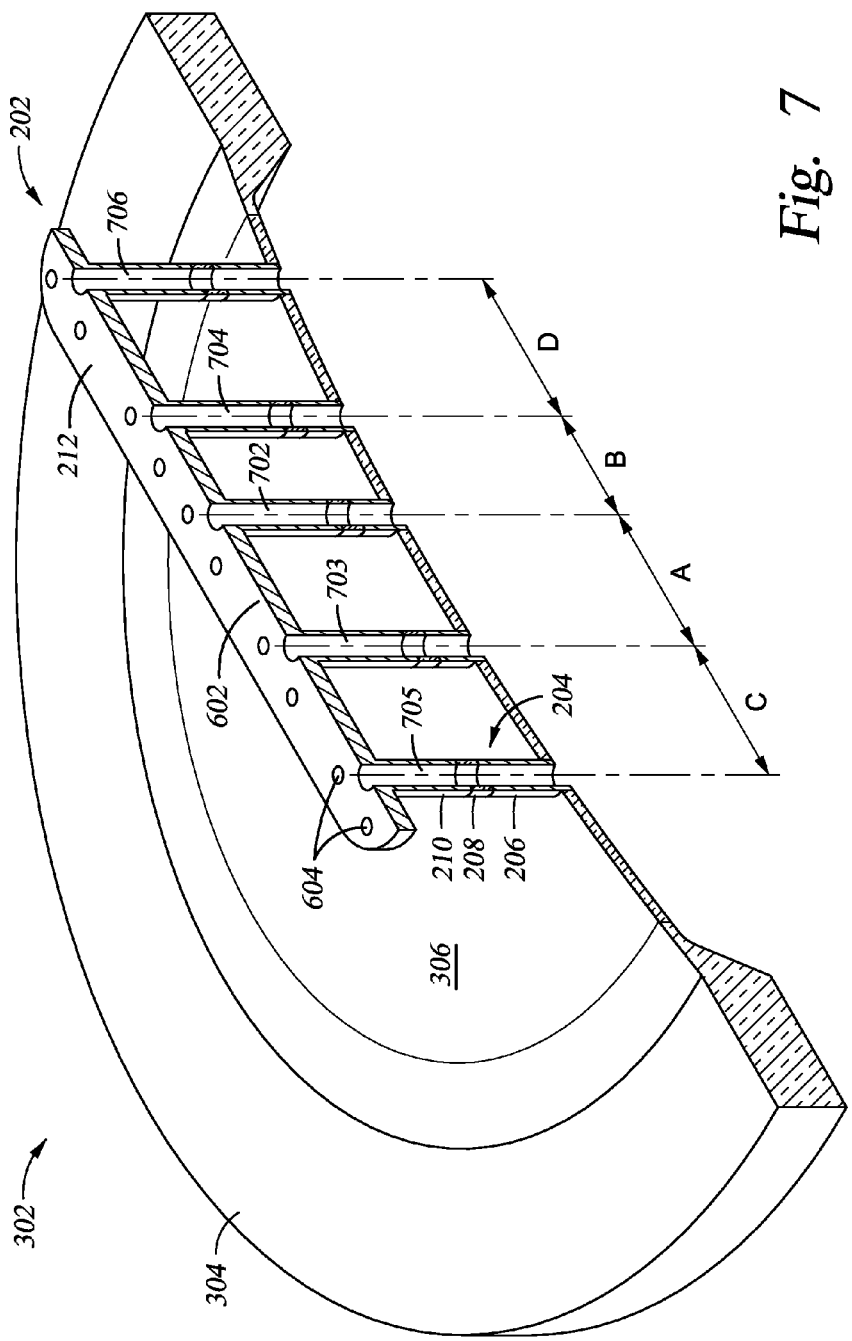
FIG. 7 illustrates cross-sectional perspective view of the dome, tubes, and flange plate of FIG. 6A.

FIG. 7 illustrates cross-sectional perspective view of the second dome 302, tubes 204, and flange plate 212 of FIG. 6A. In the embodiment illustrated, five tubes 204 are disposed along the inner region 306 of the dome 302. A central tube 702 is disposed through a central region of the upper dome 302 along the linear path occupied by the array of tubes 204. Intermediate tubes 703, 704 are disposed adjacent to and radially outward of the central tube 702 along the linear path. A distance A between the intermediate tube 703 and the central tube 702 is different than a distance B between the intermediate tube 704 and the central tube 702. Outer tubes 705, 706 are disposed adjacent to and radially outward from the intermediate tubes 703, 704 along the linear path. A distance C between the outer tube 705 and the intermediate tube 703 is different than a distance D between the outer tube 706 and the intermediate tube 704. Thus, the tubes 204 are spaced in a radially staggered fashion having a radially non-uniform spacing.

In one example, distance A is between about 10 mm and about 100 mm, such as about 35 mm. Distance B is between about 10 mm and about 90 mm, such as about 45 mm. Distance C is between about 10 mm and about 100 mm, such as about 60 mm. Distance D is between about 25 mm and about 125 mm, such as about 75 mm.

Figure 8:
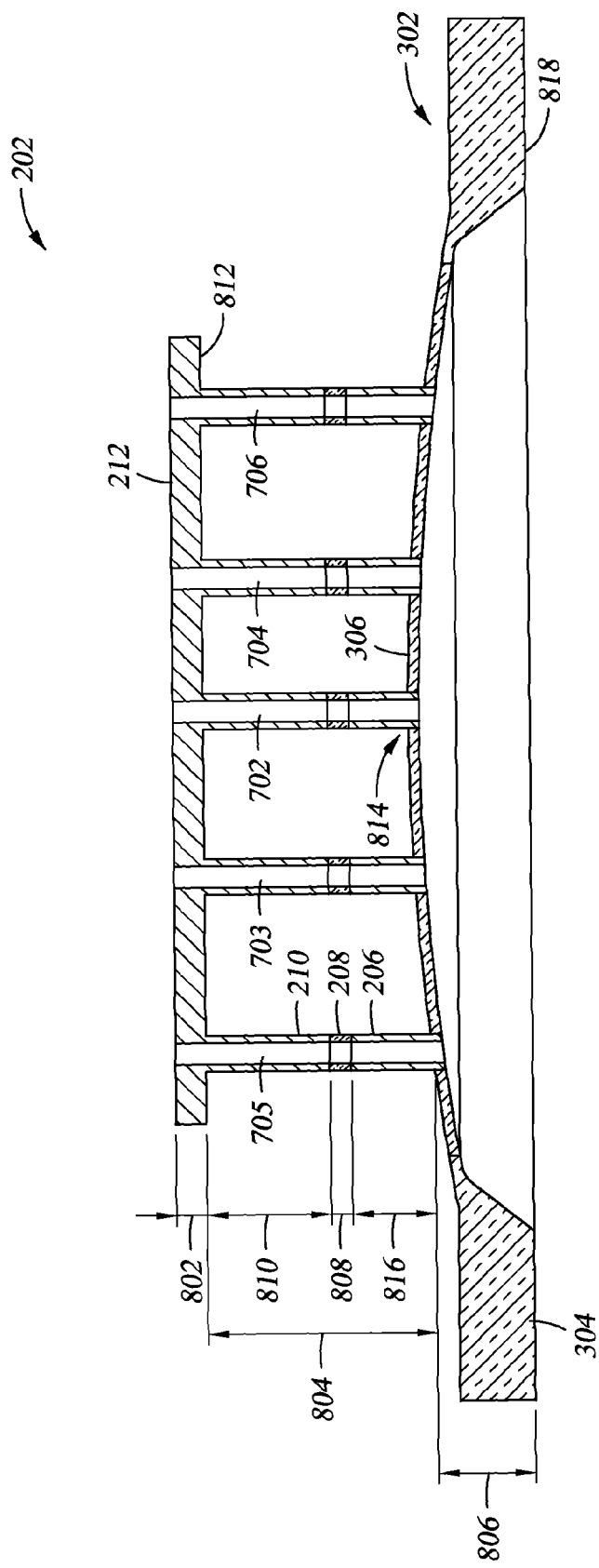
FIG. 8 illustrates a cross-sectional view of the dome, tubes, and flange plate of FIG. 6A.

The radially staggered tubes 204 provide for improved deposition coverage. The substrate 108 is rotated during processing and the radially staggered tubes 204 provide processing gases across the entire radius of the substrate 108. It is believed that the staggering of the tubes 204 provides for an improved center to edge deposition profile FIG. 8 illustrates a cross-sectional view of the second dome 302, tubes 204, and flange plate 212 of FIG. 6A. The flange plate 212 has a thickness 802 of between about 8 mm and about 16 mm, such as about 12 mm. A distance between a bottom surface 812 of the flange plate 212 and a center region 814 of the inner region 306 of the second dome 302 is between about 70 mm and about 110 mm, such as between about 80 mm and about 100 mm, such as about 87 mm. Thus, the flange plate 212 is spaced apart from the second dome 302 by approximately the distance 804 at least in the center region 814 of the second dome 302. The distance between the flange plate 212 and the inner region 306 increases along the radius outward from the center region 814 due to the curvature of the inner region 306. A thickness 806 of the second dome 302, which extends from a bottom surface 818 of the outer region 304 to the center region 814 of the inner region 306, is between about 40 mm and about 60 mm, such as about 51 mm.

A length 810 of the second member 210, which is defined as extending between the bottom surface 812 of the flange plate 212 and the thermal break 208, may be between about 20 mm and about 40 mm, such as about 28 mm. A length 808 of the thermal break 208, which is defines as extending between the first member 206 and the second member 210, may be between about 3 mm and about 12 mm, such as about 8 mm. A length 816 of the first member 206, which is defined as extending from the inner region 306 to the thermal break 208, may be at least between about 40 mm and about 60 mm, such as about 51 mm. For example, the first member 206 of the central tube 702 is defined by the length 816. The tubes 703, 704, 705, 706 disposed radially outward the central tube 702 have a first member 206 with a length greater than the length 816 of the central tube 702 due to the curvature of the inner region 306.

FIG. 9A illustrates a plan view of the second dome 302 and flange plate 212 of FIG. 6A. The process gas inlet 174 is schematically illustrated as being adjacent one side of the second dome 302. The process gas outlet 178 is adjacent a side of the second dome 302 opposite the process gas inlet 174. The flange plate 212 is disposed off center along a radius of the inner region 306. For example, the flange plate 212 is disposed a distance 902 from center of the inner region 306 toward the process gas inlet side 174. The distance 902 off center is between about 0 mm and about 50 mm, such as between about 15 mm and about 35 mm, such as about 25 mm. It is believed that the off center spacing towards the process gas inlet 174 side improves deposition uniformity when the top down gas flow interacts with the laminar cross flow provided from the process gas inlet 174.

A width 904 of the flange plate 212 is between about 40 mm and about 80 mm, such as between about 50 and about 70 mm, such as about 60 mm. A length 906 of the flange plate 212 is between about 300 mm and about 400 mm, such as between about 325 mm and about 375 mm, such as about 350 mm. In one embodiment, the flange plate 212 has a rectangular shape. In another embodiment, the flange plate 212 has a racetrack shape where opposite ends of a rectangular shape are rounded, for example, in a semi-circular shape.

Figure 9B:
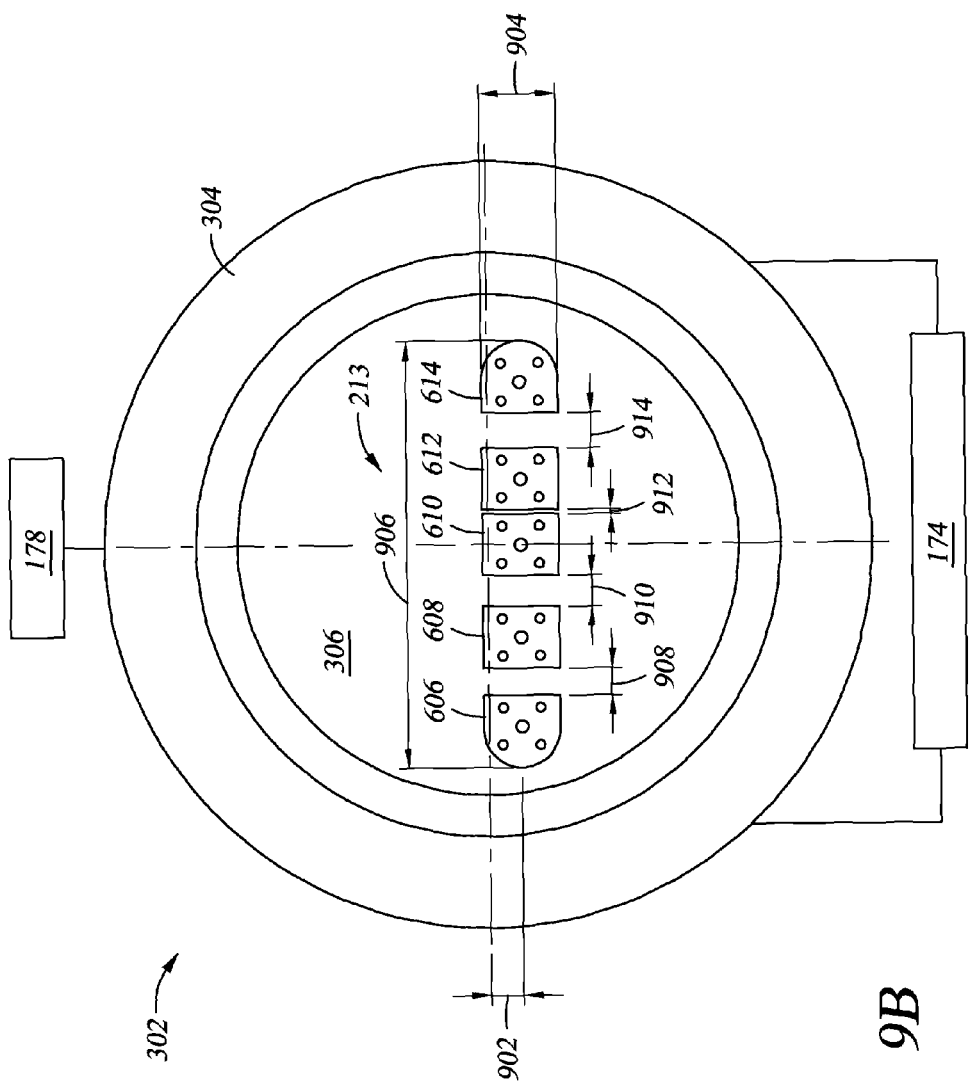
FIG. 9B illustrates a plan view of the dome and flange plate of FIG. 6B.

FIG. 9B illustrates a plan view of the second dome 302 and sectioned flange plate 213 of FIG. 6B. The distance 902 off center, and the width 904 and length 906 of the flange plate 213 are similar to the orientation and size of the flange plate 212. As such, the flange plate 213 and the flange plate 212 may be interchangeably disposed within the gas injection assembly 202.

As previously described, the spacing between adjacent portions 606, 608, 610, 612, 614 may be configured to mitigate undesirable thermal consequences of a unitary flange plate. A first space 908 separating the portion 606 and the portion 608 may extend a distance of between about 10 mm and about 30 mm, such as between about 15 mm and about 25 mm, for example, about 21.5 mm. A second space 910 separating the portion 608 and the portion 610 may extend a distance of between about 10 mm and about 30 mm, such as between about 15 mm and about 25 mm, for example, about 23 mm. A third space 912 separating the portion 610 and the portion 612 may extend a distance of between about 0.5 mm and about 10 mm, such as between about 2 mm and about 5 mm, for example, about 3 mm. A fourth space 914 separating the portion 612 and the portion 614 may extend a distance of between about 15 mm and about 35 mm, such as between about 20 mm and about 30 mm, for example, about 26.5 mm.

FIG. 10 illustrates a perspective view of the processing chamber 200 with a gas delivery assembly 1002. The gas delivery assembly functions similarly to the gas injection assembly 202 in that the gas delivery assembly 1002 delivers gas to the processing volume 156 through the second dome 302. The gas delivery assembly 1002 comprises a manifold 1006 and a plurality of tubes 1004 extending from the manifold 1006 to the second dome 302. In one embodiment, the plurality of tubes 1004 are similar to the tubes 204.

The manifold 1006 may be tubular in shape and define a volume within the manifold 1006. The volume within the manifold 1006 may be continuous or segmented. If the volume is segmented, a first segment 1008, second segment 1010, and a third segment 1012 define the manifold 1006. The segments 1008, 1010, 1012 may be in fluid communication with one another or they may be separated by a divider (not shown). Gas delivery lines 1020 deliver processing gases to the manifold 1006. The delivery lines 1020 may be configured to deliver different gases to different segments 1008, 1010, 1012 of the manifold 1006.

The second segment 1010 defines an inner zone 1014. A plurality of tubes 1004 extend from the second segment 1010 and coupled to the second dome 302 at the inner zone. Outer zones 1016, 1018 are disposed radially outward the inner zone 1014. The outer zone 1016 corresponds to the first segment 1008 and the outer zone 1018 corresponds to the third segment 1012. Tubes 204 extend from each of the first segment 1008 and the third segment 1012 to the upper dome 302 in the outer zones 1016, 1018, respectively. The inner zone 1014 and outer zones 1016, 1018 enable greater control of process gas delivery by providing flexibility with regard to various gas delivery parameters, such as flow rate, gas type, and the like.

Figure 11:
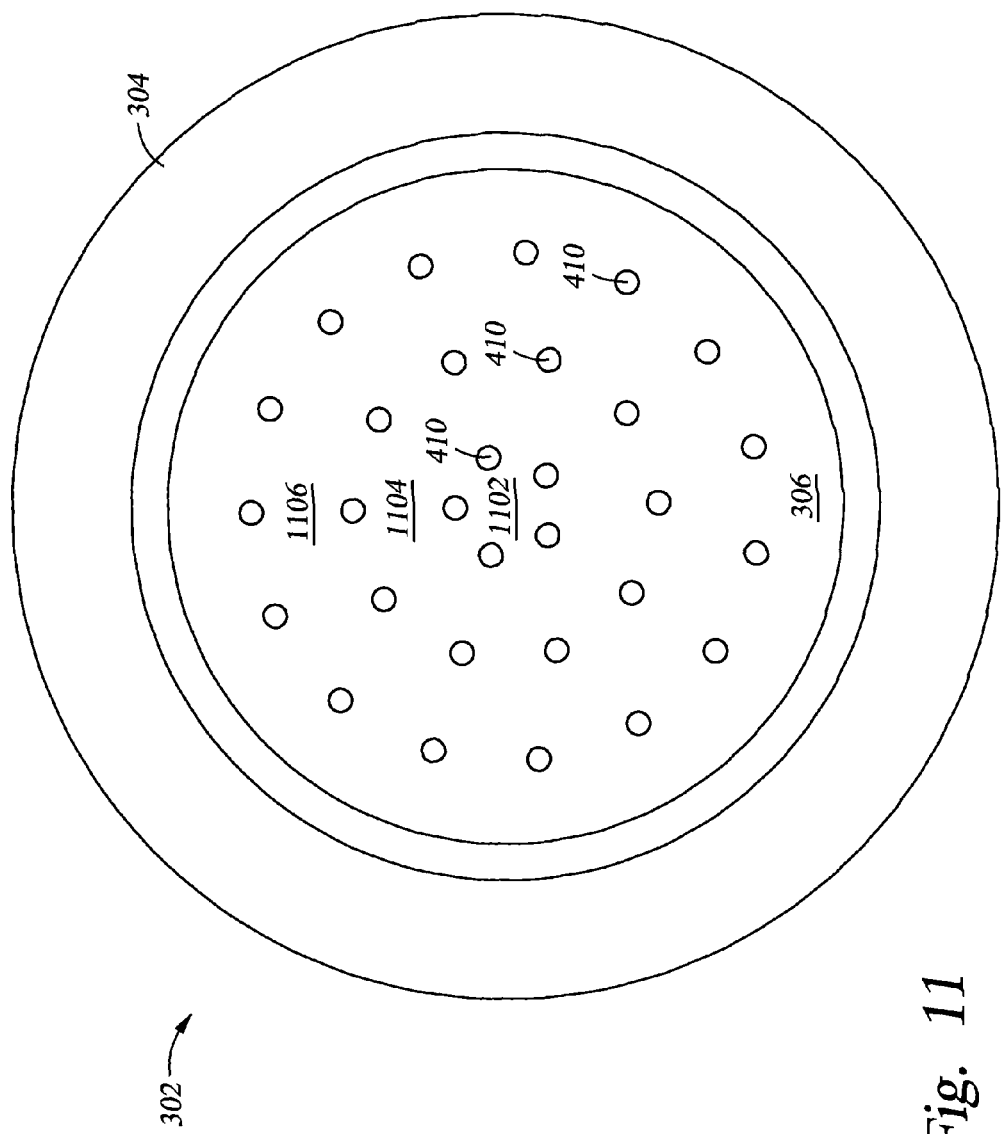
FIG. 11 illustrated a plan view of a dome according to one embodiment described herein.

FIG. 11 illustrates a plan view of the second dome 302 according to one embodiment. In this embodiment, the inner region 306 has a plurality of holes 410 formed therethrough. The holes 410 are arranged in a concentric circular formation defining various regions. For example, a first region 1102 is defined by holes near the center of the inner region 306. A second region 1104 is defined by holes 410 which surround the holes 410 of the first region 1102. A third region 1106 is defined by holes 410 which surround the holes 410 of the second region 1104. In one example, the number of holes 410 defining the first region 1102 is between about 3 holes and about 7 holes, the number of holes 410 defining the second region 1104 is between about 5 holes and about 15 holes, and the number of holes 410 defining the third region 1106 is between about 10 holes and about 25 holes.

It is contemplated that up to about 40 holes 410 may be formed through the inner region 306. Although illustrated as forming concentric circles, the holes 410 may be arranged in any pattern which provides for improved center to edge deposition uniformity of that allows for increased control of gas flow through the upper dome 302. Further, it is contemplated that a number of holes 410 in excess of about 40 holes 410 may be formed through the upper dome 302. In the embodiments described with a concentric circular array of holes 410, it is contemplated that a substrate may be rotated during the deposition process or remain stationary.

While the foregoing is directed to embodiments of the present disclosure, other and further embodiments of the disclosure may be devised without departing from the basic scope thereof, and the scope thereof is determined by the claims that follow.

The invention claimed is:

1. A gas delivery apparatus, comprising:
a light transmissive member having a plurality of holes formed therein, wherein the plurality of holes is arranged in a linear array;
a plurality of tubes coupled to and extending vertically and perpendicular to a diameter of the light transmissive member and extending from the plurality of holes; and
a flange plate coupled to at least one of the plurality of tubes.

2. The apparatus of claim 1, wherein each tube of the plurality of tubes comprises quartz.

3. The apparatus of claim 2, wherein each tube of the plurality of tubes comprises a thermal break member that is disposed on the tube between the light transmissive member and the flange plate.

4. The apparatus of claim 3, wherein each thermal break member comprises a radiation blocking member.

5. The apparatus of claim 1, wherein a distance between a diameter of the light transmissive member and a line connecting a center of each of the holes in the linear array of holes is between about 5 mm and about 50 mm.

6. The apparatus of claim 1, wherein the flange plate comprises quartz.

7. The apparatus of claim 1, wherein the flange plate is welded to the plurality of tubes.

8. The apparatus of claim 1, further comprising a metallic clamp member surrounding at least a portion of the flange plate.

9. The apparatus of claim 8, wherein a compliant member is disposed between the flange plate and the metallic clamp member.

10. An apparatus for processing a substrate, comprising:
a processing chamber body;
a light transmissive member coupled to the chamber body;
a plurality of holes formed through the light transmissive member, wherein the plurality of holes is arranged in a linear array and parallel to, and offset from, a diameter of the light transmissive member;
a plurality of tubes coupled to the light transmissive member at a first end and extending from the plurality of holes;
a flange plate coupled to a second end the plurality of tubes; and
a reflector plate coupled to the chamber body, the reflector plate disposed between the light transmissive member and the flange plate.

11. The apparatus of claim 10, wherein the plurality of tubes extend through the reflector plate.

12. The apparatus of claim 10, wherein the reflector plate comprises a first member and a second member mated to the first member at a region where the plurality of tubes extend through the reflector plate.

13. The apparatus of claim 10, wherein a temperature sensor is coupled to a top surface of the reflector plate.

14. The apparatus of claim 10, wherein the plurality of holes arranged in a linear array include a first hole and a plurality of second holes, wherein the first hole is at a central area of the light transmissive member and each of the plurality of second holes is a different distance from the first hole.

15. The apparatus of claim 10, wherein each tube comprises a thermal break member.

16. The apparatus of claim 15, wherein each tube comprises a first quartz portion that extends from the light transmissive member to the thermal break member and a second portion that extends from the thermal break member to the flange plate.

17. An apparatus for processing a substrate, comprising:
a processing chamber body;
a first dome coupled to the chamber body;
a second dome coupled to the chamber body opposite the first dome, the chamber body, first dome, and the second dome defining a processing volume;
a substrate support disposed within the processing volume;
a lamp array coupled to the chamber body outside the processing volume;
a plurality of holes formed through the second dome;
a tube coupled to each of the plurality of holes and extending from each hole away from the processing volume;

a flange plate coupled to each tube; and a reflector plate coupled to the chamber body, the reflector plate disposed between the second dome and the flange plate.

18. The apparatus of claim 17, wherein a thermal break member is coupled to each tube between the reflector plate and the flange plate.

19. The apparatus of claim 17, further comprising a clamp member partially surrounding the flange plate and a compliant member disposed between the clamp member and the flange plate.

20. The apparatus of claim 17, wherein each of the first and second domes is quartz.

\* \* \* \* \*